(12) United States Patent
Van Der Pasch et al.

(10) Patent No.: US 7,999,912 B2
(45) Date of Patent: Aug. 16, 2011

(54) LITHOGRAPHIC APPARATUS AND SENSOR CALIBRATION METHOD

(75) Inventors: Engelbertus Antonius Fransiscus Van Der Pasch, Oirschot (NL); Emiel Jozef Melanie Eussen, Eindhoven (NL); Stefan Gertrud Marie Hendriks, Waalre (NL); Erik Roelof Loopstra, Heeze (NL); Jacob Willem Vink, Eindhoven (NL); Ruud Antonius Catharina Maria Beerens, Roggel (NL); Lodewijk Alexander Schijvenaars, Zevenbergschenhoek (NL); Tom Van Zutphen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1131 days.

(21) Appl. No.: 11/797,901

(22) Filed: May 8, 2007

(65) Prior Publication Data
US 2008/0278702 A1    Nov. 13, 2008

(51) Int. Cl.
G03B 27/42    (2006.01)
(52) U.S. Cl. ................. 355/53; 355/72; 355/77
(58) Field of Classification Search ........... 355/53, 355/72, 77
See application file for complete search history.

(56) References Cited

U.S. PATENT DOCUMENTS

| | | | |
|---|---|---|---|
| 2002/0145717 A1* | 10/2002 | Baselmans et al. | 355/55 |
| 2003/0047674 A1* | 3/2003 | Thornburn et al. | 250/231.13 |
| 2004/0263846 A1 | 12/2004 | Kwan | |
| 2005/0274878 A1* | 12/2005 | Goldman et al. | 250/231.13 |

FOREIGN PATENT DOCUMENTS

| | | |
|---|---|---|
| JP | 2002-151405 A1 | 5/2002 |
| JP | 2002/334831 A1 | 11/2002 |
| JP | 2006-054452 A1 | 2/2006 |

OTHER PUBLICATIONS

Office Action in related Korean Patent Application 10-2008-0042343 mailed Nov. 19, 2009.
Office Action in related Japanese application No. 2008-119765 mailed Dec. 1, 2010.

* cited by examiner

*Primary Examiner* — Edward J Glick
*Assistant Examiner* — Mesfin T Asfaw
(74) *Attorney, Agent, or Firm* — Pillsbury Winthrop Shaw Pittman LLP

(57) ABSTRACT

A method for calibrating an auxiliary sensor system is provided. The auxiliary sensor system measures a position of a grating relative to a reference, the grating forming part of an encoder measurement system. The encoder measurement system is adapted to measure a position of a substrate table of a lithographic apparatus and further comprises a sensor mounted to the substrate table. The method comprises exciting the grating to make a movement in at least one measurement direction of the auxiliary sensor system, obtaining an auxiliary sensor system output signal from the sensor system during the movement, and adjusting a parameter of the auxiliary sensor system based on the output signal obtained during the movement to thereby calibrate the auxiliary sensor system.

25 Claims, 3 Drawing Sheets

US 7,999,912 B2

LITHOGRAPHIC APPARATUS AND SENSOR CALIBRATION METHOD

BACKGROUND

1. Field of the Invention

The present invention relates to methods for calibrating an auxiliary sensor system, lithographic apparatuses and a position measurement system to measure a position of an object.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed in a lithographic apparatus to make use of an encoder measurement system to measure a position of the substrate stage. Thereto, the substrate stage may be provided with an encoder sensor, which directs a measurement beam to a grating. The grating may be connected to a structure of the lithographic apparatus, such as the metrology frame of the lithographic apparatus. The reference structure may however be subjected to vibrations or other mechanical disturbances, which may result in vibrations of the grating attached to it. Naturally, such vibrations may result in an inaccuracy of the encoder measurement system, as a displacement of the grating with respect to a desired position thereof, may result in an error in the reading out of the corresponding encoder.

To address this problem, an auxiliary sensor system may be provided to measure a position of the grating with respect to a reference. By correcting the read-out of the encoder system for the position deviation of the grating as provided by the auxiliary sensor system, a measurement accuracy of the encoder measurement system may be increased, thereby possibly reducing an effect of the mentioned vibrations or other disturbances.

SUMMARY

It is desirable to facilitate a calibration of the auxiliary sensor system.

According to an embodiment of the invention, there is provided a method for calibrating an auxiliary sensor system. The auxiliary sensor system can be used to measure a position of a grating relative to a reference, the grating forming part of an encoder measurement system to measure a position of a substrate table of a lithographic apparatus, wherein the encoder measurement system further comprises a sensor mounted to the substrate table. The method comprises:

exciting the grating to make a movement in at least a measurement direction of the auxiliary sensor system;
obtaining an auxiliary sensor system output signal from the sensor system during the movement; and
adjusting a parameter of the auxiliary sensor system based on the output signal obtained during the movement to thereby calibrate the auxiliary sensor system.

In another embodiment of the invention, there is provided a lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate.

The lithographic apparatus further comprises an encoder measurement system to measure a substrate table position. The encoder measurement system comprises a sensor mounted to the substrate table and a sensor target comprising a grating. An auxiliary sensor system is provided to measure a position of the grating relative to a reference, and an excitement device is provided to excite the grating. The lithographic apparatus is arranged to:

excite the grating by the excitement device to thereby move the grating in at least a measurement direction of the auxiliary sensor system;
obtain an auxiliary sensor system output signal from the sensor system during the movement; and
adjust a parameter of the auxiliary sensor system from the obtained output signal to thereby calibrate the auxiliary sensor system.

According to a further embodiment of the invention, there is provided a lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate.

The lithographic apparatus further comprises an encoder measurement system to measure a position of one of the substrate table and the support. The encoder measurement system comprises a sensor mounted to the one of the substrate table and the support, and a sensor target comprising a grating. An auxiliary sensor system is provided to measure a position of the grating relative to a reference, and an excitement device is provided to excite the grating. The lithographic apparatus is arranged to:

excite the grating by the excitement device to thereby move the grating in at least a measurement direction of the sensor system;
obtain an auxiliary sensor system output signal from the auxiliary sensor system during the moving; and
adjust a parameter of the auxiliary sensor system from the obtained output signal to thereby calibrate the auxiliary sensor system.

According to a still further embodiment of the invention, there is provided a position measurement system to measure a position of an object, the position measurement system comprising a sensor mounted to the object, and a sensor target comprising a grating. The position measurement system further comprises an auxiliary sensor system to measure a position of the grating relative to a reference, and an excitement device to excite the grating. The position measurement system is arranged to:

- excite the grating by the excitement device to thereby move the grating in at least a measurement direction of the auxiliary sensor system;
- obtain an auxiliary sensor system output signal from the sensor system during the moving; and
- adjust a parameter of the auxiliary sensor system from the obtained output signal to thereby calibrate the auxiliary sensor system.

According to an again still further embodiment of the invention, there is provided a method for calibrating an incremental sensor system, the sensor system to measure a position of a grating relative to a reference. The grating is part of an encoder measurement system to measure a position of an object. The encoder measurement system further comprises a sensor mounted to the object. The method comprises:

- exciting the grating to make a movement in at least a measurement direction of the sensor system;
- obtaining a sensor system output signal from the sensor system during the movement; and
- adjusting a parameter of the sensor system based on the output signal obtained during the movement to thereby calibrate the sensor system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
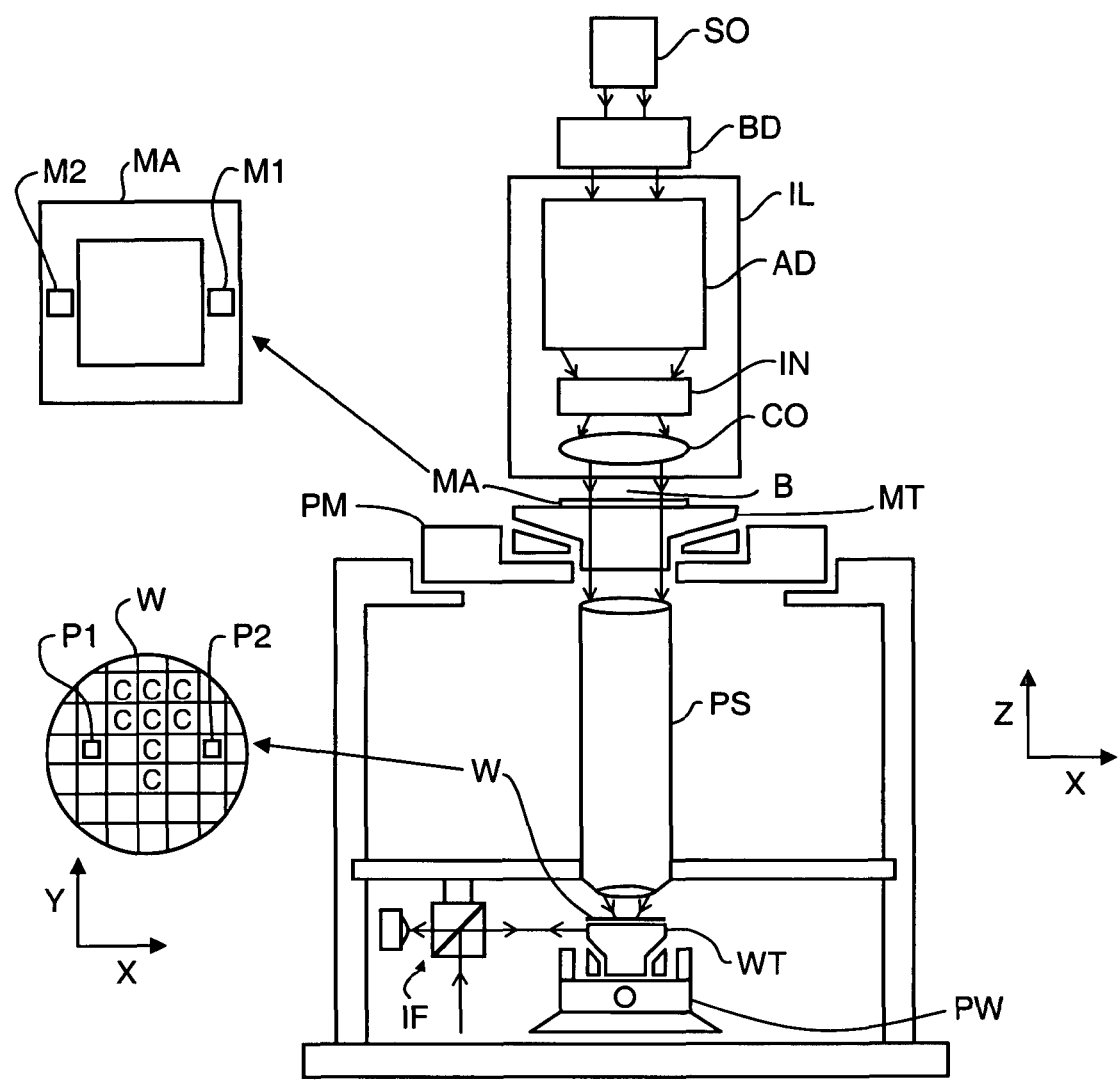
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The mask support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device MA is held in a vacuum or a low (gas, air or predefined gas mixture) pressure environment. The mask support structure MT can use mechanical, vacuum, electrostatic or other clamping techniques to hold the patterning device MA. The mask support structure MT may be a frame or a table, for example, which may be fixed or movable as required. The mask support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion C of the substrate W. It should be noted that the pattern imparted to the radiation beam B may not exactly correspond to the desired pattern in the target portion C of the substrate W, for example if the pattern includes phase-shifting features or so-called assist features. Generally, the pattern imparted to the radiation beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual-stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the mask MA and the projection system PS. Immersion techniques can be used to increase the numerical aperture of projection systems PS. The term "immersion" as used herein does not mean that a structure, such as a substrate W, must be submerged in liquid, but rather only means that a liquid is located between the projection system PS and the substrate W during exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam B is passed from the source SO to the illuminator IL with the aid of a beam delivery system BD including, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may include an adjuster AD configured to adjust the angular intensity distribution of the radiation beam B. Generally, at least the outer and/or inner radial extent (commonly referred to as σ-outer and σ-inner, respectively) of the intensity distribution in a pupil plane of the illuminator IL can be adjusted. In addition, the illuminator IL may include various other components, such as an integrator IN and a condenser CO. The illuminator IL may be used to condition the radiation beam B, to have a desired uniformity and intensity distribution in its cross-section.

The radiation beam B is incident on the patterning device (e.g., mask MA), which is held on the mask support structure (e.g., mask table MT), and is patterned by the patterning device MA. Having traversed the mask MA, the radiation beam B passes through the projection system PS, which focuses the beam B onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks P1,P2 as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam B is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam B is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes a programmable patterning device, such as a programmable mirror array of a type as referred to above.

Combinations and/or variations on the above-described modes of use or entirely different modes of use may also be employed.

Figure 2:
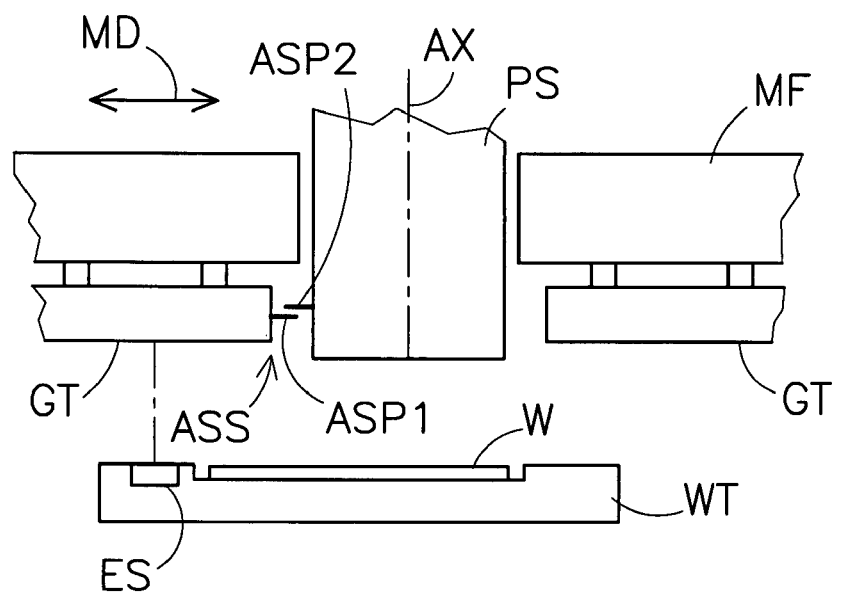
FIG. 2 depicts a schematic view of a part of a lithographic apparatus according to an embodiment of the invention.

FIG. 2 highly schematically depicts a wafer stage WT, also indicated herein as a substrate stage. The substrate stage WT holds a substrate W, which is to be irradiated via projection system PS. To measure a position of the substrate stage WT, an encoder is provided which comprises a grating GT, comprising a one or two dimensional pattern and an encoder sensor ES which may comprise a combination of a light source to generate a beam directed to the grating GT, and a sensor to detect a beam arriving back at the encoder sensor ES. A displacement of the substrate stage WT will result in a displacement of the encoder sensor ES with respect to the grating GT, which will, due to the one or two dimensional pattern on the grating, provide a corresponding change in the signal provided by the encoder sensor ES, as the optical energy returned to the sensor ES will be altered due to the passage of elements (such as lines, stripes, dots, etc.) of the grating GT. In this embodiment, the grating GT is connected to the metrology frame MF, which may provide a reference structure of the lithographic apparatus. The projection system PS may also be held by the metrology frame MF, either in a rigid way, or by means of an active or passive, rigid or resilient mounting (not shown).

A problem is that the metrology frame MF may be subjected to vibrations, disturbances or other effects which may cause the grating GT to move with respect to a reference, in this example the projection system PS, or more precisely an optical axis AX of the projection system PS. Such movements of the grating GT may result in an inaccuracy of the measurement by the encoder of which the grating GT is a part. Other causes of a displacement of the grating GT may be present, and may be found e.g. in thermal expansion, etc.

To be able to compensate for such effects to a certain degree, an auxiliary sensor system ASS may be provided which measures a position of the grating GT with respect to a reference, in this example the projection system PS, more precisely the optical axis AX thereof. The auxiliary sensor system ASS may, in turn, comprise an encoder which measures a position of auxiliary system part ASP1 with respect to auxiliary system part ASP2. Auxiliary system part ASP2 may for example be connected to a lens mounting of the downstream projection lens of the projection system PS. Requirements on resolution of the auxiliary sensor system ASS may be high, and be comparable to or lower than a positioning accuracy requirement of the substrate stage WT, as any measurement error of the auxiliary sensor system ASS will result in a measurement error of the substrate stage WT with respect to the projection system PS or optical axis AX thereof. Therefore, a periodic calibration of the auxiliary sensor system ASS may be required or desirable. The auxiliary sensor system ASS may for example comprise an incremental encoder such as an optical incremental encoder, although other types of sensors also may be used, such as capacitive sensors, inductive sensors (e.g. Eddy current, LVDTs (linear variable differential transformers), interferometers. In the case of an incremental encoder, a variety of effects may result in inaccuracies thereof, for example light intensity and reflection variations, non-linearity within one signal period, etc. To be able to take account of such effects, a periodic calibration may be required.

The present invention can be used to address the challenges associated with calibrating the auxiliary sensor system ASS up to the required level of accuracy. Removal of the auxiliary sensor system ASS and calibration outside of the lithographic apparatus may not be a viable option, as the removal and replacement itself might generate errors, which could not be taken into account with the calibration. Instead, in accordance with an aspect of the present invention, the calibration may be performed by exciting the grating to make a movement in at least a measurement direction (in this example the measurement direction being schematically indicated by MD in FIG. 2) of the auxiliary sensor system ASS, obtaining an auxiliary sensor system output signal from the auxiliary sensor system ASS during the movement, and adjusting a parameter of the auxiliary sensor system ASS based on the output signal thus obtained. To perform the calibration, a variety of parameters of the auxiliary sensor system ASS may be adjusted e.g. a laser power, a laser wavelength, a gain and/or an offset thereof. Also, non-linearity of the auxiliary sensor system ASS may be calibrated, as a pattern of the auxiliary sensor system output signal may be compared with the movement, to derive any deviations in response of the auxiliary sensor system ASS as compared to a desired response thereof.

Figure 3A:
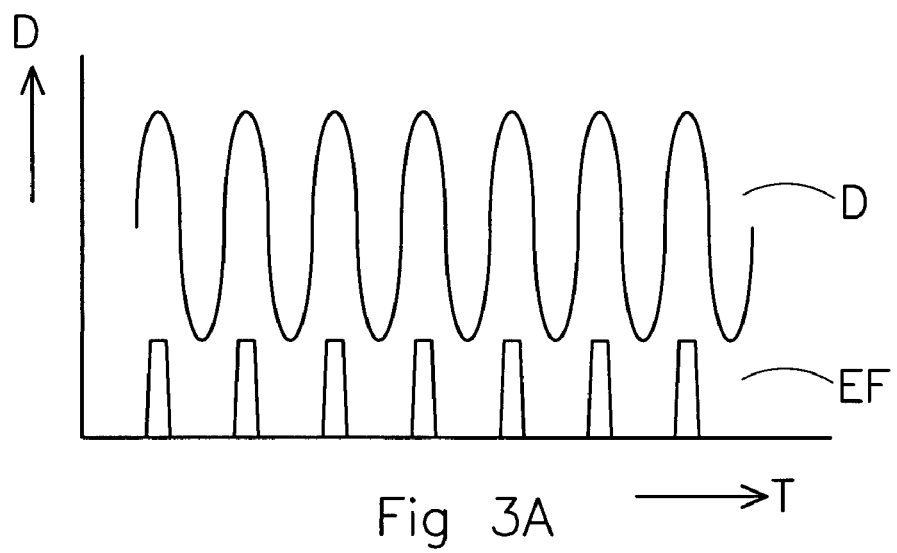
FIGS. 3A-3C depict timing diagrams of a movement of the grating and an excitation pattern thereof.

Due to a high stiffness of the mounting of the grating GT to the metrology frame MF, and the high forces that would consequently be required for such movement of the grating GT, the excitation may be provided in synchronism with a resonance frequency of the grating, to thereby provide a relatively large amplitude of grating movement with a relatively low force. An example thereof is provided in FIG. 3A where a pulsed excitation force EF is provided in synchronism with a resonance of the grating, the grating thereby providing displacement D as depicted in FIG. 3A.

Figure 3B:
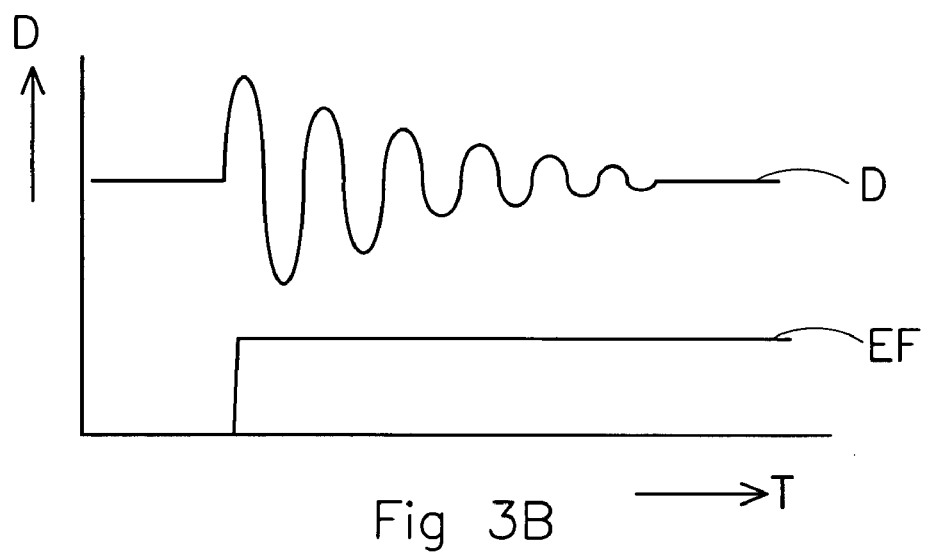
Figure 3C:
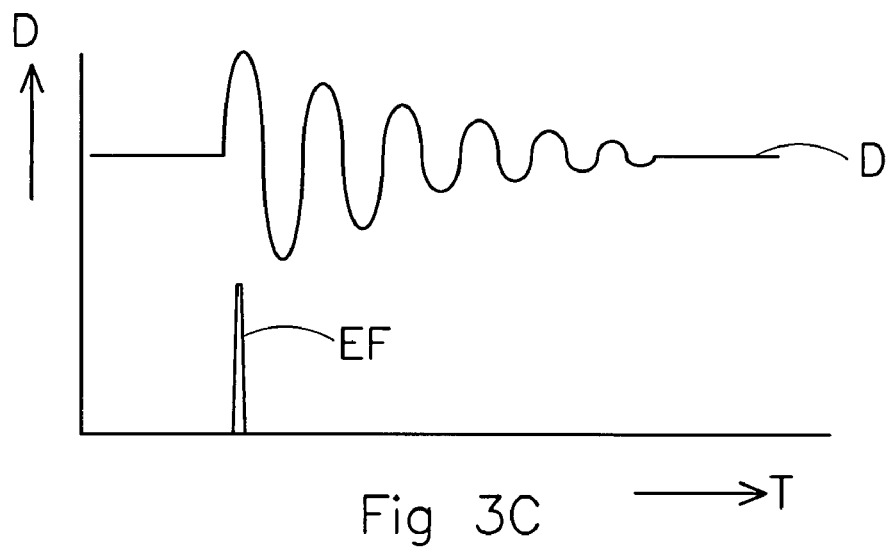

Alternatively, the excitation can be provided by a step function (as depicted in FIG. 3B) or an impulse function (as depicted in FIG. 3C) to generate a resonance of the grating.

The herein disclosed aspects of the present invention may also be applied in a measurement stage of a so-called dual-stage lithographic apparatus. Also, during the measurement cycle, alignment marks on the surface of the substrate W and/or on the substrate table WT are measured. The auxiliary sensor system ASS may but does not necessarily need to provide for a measurement in one or more horizontal directions.

Figure 4:
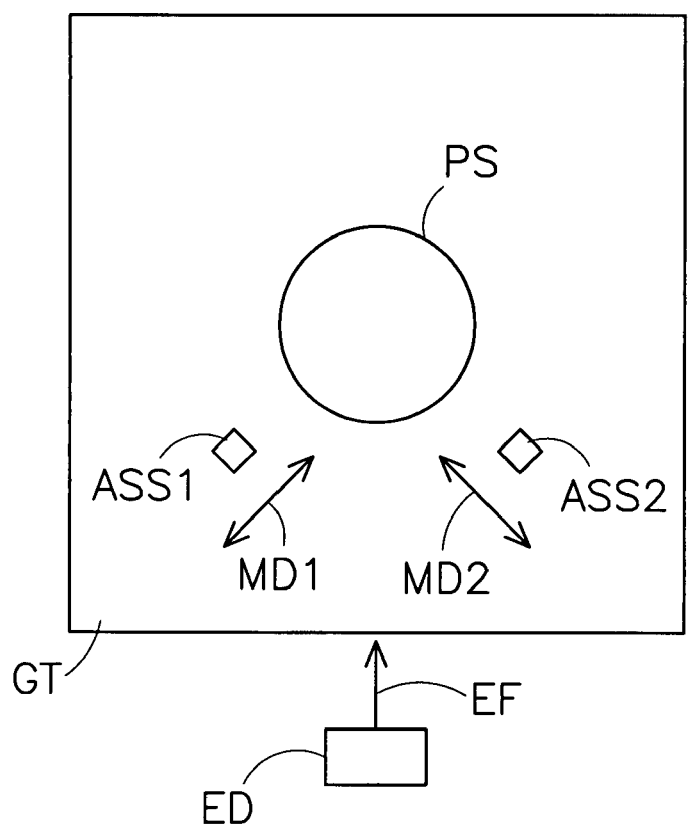
FIG. 4 depicts a schematic top view of the auxiliary measurement system and the excitation device according to an embodiment of the invention.

FIG. 4 schematically shows a top view of grating GT and projection system PS. In this example, two auxiliary sensor systems ASS are provided, i.e. auxiliary sensor system ASS1 and auxiliary sensor system ASS2, however in other embodiments, more auxiliary sensors may be provided. Auxiliary sensor system ASS1 measures a position of the grating GT with respect of the projection system PS in a measurement direction MD1, while auxiliary sensor system ASS2 measures a position of the grating GT with respect to the projection system PS in a second measurement direction MD2. The first and second measurement directions MD1, MD2 in this example are perpendicular to each other, both measurement directions being along a surface of the grating GT, and being in a direction of movement of the wafer stage WT.

FIG. 4 further shows the excitation device ED which provides for the excitation of the grating GT by excitation force EF, a direction of the force being such that a movement of the grating due to the excitation force is under an angle of substantially 45 degrees with respect to the first and second measurement directions MD1, MD2. Thereby, a single movement of the grating GT may suffice to provide for a movement of the grating GT in about the first and second measurement directions MD1, MD2, and allowing to calibrate the first and second auxiliary sensor systems ASS1, ASS2 from the same movement.

A variety of actuators may be applied, for example a pneumatic actuator, a hydraulic actuator, a gas flow actuator providing e.g. a pulsed gas flow, a suction pneumatic actuator, a piezo-electric actuator, a traverse power excited string actuator wherein a string pulling on a grating is provided with a traverse force to increase a traction by the string as required, an electromagnetic actuator, acoustic actuator, etc.

In the above examples, it has been assumed that the actuator acts on the grating GT. A number of other possibilities may however be provided: it is for example possible that the actuator exists at a lens mount of the lithographic apparatus. In some lithographic apparatus designs, one or more of the lenses of the projection system PS may be provided with active lens mounts comprising actuators to position the lens in question. By actuating such actuators to e.g. provide a frequency, which corresponds to a resonance frequency of the grating, a vibration pattern could be generated in the projection system PS, and hence in the metrology frame and/or grating, which could as a consequence result in a resonance of the grating. As a further example, the actuator, in other words the excitement device, could act on the metrology frame and thereby cause e.g. the metrology frame to vibrate at a (non-resonant or resonant) frequency which largely coincides with a resonance mode of the grating GT which may result in a resonance of the grating.

Although in the above, the principles according to the invention have been described with reference to the substrate stage WT and substrate stage positioning, the principals described here may equally well be applied for a positioning of the mask stage MT, also referred to as the support.

Further, in the above, reference has been made to a resonance of the grating GT. Such resonance may comprise any resonance mode in which a movement of the grating GT in the respective measurement direction MD, MD1, MD2 is provided. The direction of the movement may comprise a direction substantially perpendicular to the optical axis AX of the projection system PS.

The above may not only apply to a lithographic apparatus, wherever the method of calibration may be applied to any auxiliary sensor system which measures a position of a grating, the grating forming part of an encoder measurement system.

Although specific reference may be made in this text to the use of a lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for calibrating an auxiliary sensor system, the auxiliary sensor system being adapted to measure a position of a grating relative to a reference, the grating forming part of an encoder measurement system to measure a position of a substrate table of a lithographic apparatus, the encoder measurement system further comprising a sensor mounted to the substrate table, the method comprising:
    exciting the grating to make a movement in at least one measurement direction of the auxiliary sensor system;
    obtaining an auxiliary sensor system output signal from the auxiliary sensor system during the movement; and
    adjusting a parameter of the auxiliary sensor system based on the output signal obtained during the movement to thereby calibrate the auxiliary sensor system.

2. A method for calibrating an auxiliary sensor system, the auxiliary sensor system being adapted to measure a position of a grating relative to a reference, the grating forming part of an encoder measurement system to measure a position of a substrate table of a lithographic apparatus, the encoder measurement system further comprising a sensor mounted to the substrate table, the method comprising:
    exciting the grating to make a movement in at least one measurement direction of the auxiliary sensor system;
    obtaining an auxiliary sensor system output signal from the auxiliary sensor system during the movement; and
    adjusting a parameter of the auxiliary sensor system based on the output signal obtained during the movement to thereby calibrate the auxiliary sensor system,
    wherein the excitation of the grating is performed in synchronism with a resonance frequency of the grating.

3. The method according to claim 1, wherein the excitation comprises exciting the grating by a step function or an impulse function.

4. The method according to claim 1, wherein the movement is in a direction substantially along a plane of movement of the substrate table of the lithographic apparatus.

5. The method according to claim 1, wherein the reference is one of a lithographic apparatus projection lens and a lithographic apparatus alignment measurement device.

6. The method according to claim 1, wherein the adjusting of a parameter of the auxiliary sensor system comprises adjusting at least one of a laser power, a laser wavelength, a gain and an offset of the auxiliary sensor system.

7. The method according to claim 1, wherein the measurement direction comprises first and second measurement directions which are substantially perpendicular to each other and wherein the movement is at an angle of substantially 45 degrees with respect to the first and second measurement directions.

8. The method according to claim 1, wherein the grating is excited by at least one of a pneumatic actuator, an hydraulic actuator, a gas flow actuator, a suction pneumatic actuator, a piezo-electric actuator, a traverse power excited string actuator, an electromagnetic actuator and an acoustic actuator.

9. The method according to claim 1, wherein the excitation of the grating comprises exciting a lens mount actuator of the lithographic apparatus.

10. The method according to claim 1, wherein the excitation of the grating comprises actuating a metrology frame at a resonance frequency of the projection lens or the grating.

11. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate;

a projection system configured to project the patterned radiation beam onto a target portion of the substrate;

an encoder measurement system adapted to measure a substrate table position, the encoder measurement system comprising a sensor mounted to the substrate table and a sensor target comprising a grating;

an auxiliary sensor system adapted to measure a position of the grating relative to a reference; and an excitement device adapted to excite the grating, wherein the lithographic apparatus is arranged to:

excite the grating by way of the excitement device to thereby move the grating in at least a measurement direction of the auxiliary sensor system;

obtain an auxiliary sensor system output signal from the auxiliary sensor system during the movement; and adjust a parameter of the auxiliary sensor system from the obtained output signal to thereby calibrate the auxiliary sensor system.

12. The lithographic apparatus according to claim 11, wherein the excitement device is adapted to perform the excitation in synchronism with a resonance frequency of the grating.

13. The lithographic apparatus according to claim 11, wherein the excitement device is adapted to perform the excitation of the grating according to a step function or an impulse function.

14. The lithographic apparatus according to claim 11, wherein the movement is in a direction substantially along a plane of movement of the substrate table of the lithographic apparatus.

15. The lithographic apparatus according to claim 11, wherein the reference is a lithographic apparatus projection lens or a lithographic apparatus alignment measurement device.

16. The lithographic apparatus according to claim 11, wherein said lithographic apparatus is adapted to perform calibration of the auxiliary sensor system by calibrating at least one of a laser power, a laser wavelength, a gain and an offset of the sensor system.

17. The lithographic apparatus according to claim 11, wherein the measurement direction comprises first and second measurement directions which are substantially perpendicular to each other and wherein said excitement device is adapted to move the grating at an angle of substantially 45 degrees with respect to the first and second measurement directions.

18. The lithographic apparatus according to claim 11, wherein the excitement device comprises at least one of a pneumatic actuator, an hydraulic actuator, a gas flow actuator, a suction pneumatic actuator, a piëzo-electric actuator, a traverse power excited string actuator, an electromagnetic actuator and an acoustic actuator.

19. The lithographic apparatus according to claim 11, wherein the excitement device is adapted to excite the grating by exciting a lens mount actuator of the lithographic apparatus.

20. The lithographic apparatus according to claim 11, wherein the excitement device is adapted to excite the grating by actuating a metrology frame at a resonance frequency of the projection lens or the grating.

21. A lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate;

an encoder measurement system to measure a position of one of the substrate table and the support, the encoder measurement system comprising a sensor mounted to the one of the substrate table and the support, and a sensor target comprising a grating;

an auxiliary sensor system to measure a position of the grating relative to a reference; and an excitement device adapted to excite the grating, wherein the lithographic apparatus is arranged to:

excite the grating by way of the excitement device to thereby move the grating in at least a measurement direction of the auxiliary sensor system;

obtain an auxiliary sensor system output signal from the auxiliary sensor system during the movement; and adjust a parameter of the auxiliary sensor system from the obtained output signal to thereby calibrate the auxiliary sensor system.

22. A position measurement system to measure a position of an object, the position measurement system comprising:

a sensor mounted to the object;

a sensor target comprising a grating;

an auxiliary sensor system adapted to measure a position of the grating relative to a reference; and an excitement device adapted to excite the grating, the position measurement system being arranged to:

excite the grating by way of the excitement device to thereby move the grating in at least a measurement direction of the auxiliary sensor system;

obtain an auxiliary sensor system output signal from the auxiliary sensor system during the movement; and adjust a parameter of the auxiliary sensor system from the obtained output signal to thereby calibrate the auxiliary sensor system.

23. A method for calibrating an incremental sensor system, wherein the incremental sensor system is adapted to measure a position of a grating relative to a reference, the grating forming part of an encoder measurement system to measure a position of an object, the encoder measurement system further comprising a sensor mounted to the object, the method comprising:

exciting the grating to make a movement in at least one measurement direction of the sensor system;

obtaining a sensor system output signal from the sensor system during the movement; and adjusting a parameter of the sensor system based on the output signal obtained during the movement to thereby calibrate the sensor system.

24. The method according to claim 1, wherein the auxiliary sensor system includes a first auxiliary sensor system part that is arranged on the grating, and wherein the exciting includes exciting the grating to make a movement of the first auxiliary sensor system part in at least one measurement direction of the auxiliary sensor system.

25. The method according to claim 24, wherein the obtaining includes measuring a position of the first auxiliary sensor system part.

* * * * *